US007179583B2

(12) United States Patent
Roshelli et al.

(10) Patent No.: US 7,179,583 B2
(45) Date of Patent: Feb. 20, 2007

(54) EDGE CURE PREVENTION COMPOSITION AND PROCESS FOR USING THE SAME

(76) Inventors: Albert Roshelli, 1105 Astoria La., Peachtree City, GA (US) 30269; David Recchia, 2166 Goodwood Blvd., Smyrna, GA (US) 30080

( * ) Notice: Subject to any disclaimer, the term of this patent is extended or adjusted under 35 U.S.C. 154(b) by 190 days.

(21) Appl. No.: 10/977,049

(22) Filed: Oct. 29, 2004

(65) Prior Publication Data

US 2006/0093962 A1    May 4, 2006

(51) Int. Cl.
*G03F 7/00* (2006.01)
*G03C 5/00* (2006.01)

(52) U.S. Cl. .................. 430/322; 430/300; 430/423; 430/328

(58) Field of Classification Search ............... None
See application file for complete search history.

(56) References Cited

U.S. PATENT DOCUMENTS

| 4,522,807 | A | 6/1985 | Kaplan |
|---|---|---|---|
| 4,927,740 | A | 5/1990 | Wallbillich et al. |
| 5,736,125 | A | 4/1998 | Morawsky et al. |
| 5,910,858 | A * | 6/1999 | Frey et al. .................. 359/534 |
| 5,989,529 | A | 11/1999 | Kaplan |
| 6,099,825 | A | 8/2000 | McShane et al. |
| 6,326,124 | B1 | 12/2001 | Alince et al. |
| 6,423,303 | B1 | 7/2002 | Ryklin et al. |
| 6,602,515 | B2 | 8/2003 | Chaudhuri |
| 2004/0067443 | A1* | 4/2004 | Salvestro .................. 430/306 |
| 2004/0170920 | A1 | 9/2004 | Goto |
| 2004/0245541 | A1* | 12/2004 | Shitagaki et al. .......... 257/103 |

* cited by examiner

*Primary Examiner*—John A. McPherson
*Assistant Examiner*—Daborah Chacko-Davis
(74) *Attorney, Agent, or Firm*—Carmody & Torrance LLP

(57) ABSTRACT

An edge-covering composition for covering the cut surfaces of a photosensitive printing element to prevent premature curing of the cut surfaces during a process of manufacturing the printing element. The edge-covering composition is an emulsion comprising one or more emulsifiers, one or more-ultraviolet radiation-absorbing materials, optionally, a coloring agent, and optionally, one or more additional additives. The emulsion compositions are easy to apply, non-toxic, inexpensive, and are largely compatible with the solvents used to wash uncured photopolymer from the printing elements during processing.

22 Claims, No Drawings

EDGE CURE PREVENTION COMPOSITION AND PROCESS FOR USING THE SAME

FIELD OF THE INVENTION

The present invention relates to improved methods of preventing premature curing of cut surfaces of a photosensitive relief image printing plate during the manufacturing process.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; a protective layer or slip film; and a cover sheet.

The backing layer lends support to the plate, and is typically a plastic film or sheet, which may be transparent or opaque.

The photocurable layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photocurable materials generally cross-link (cure) and harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The slip film is a thin sheet, which protects the photopolymer from dust and increases its ease of handling. In a conventional plate making process, the slip film is transparent to UV light. In this process, the printer peels the cover sheet off the printing plate blank, and places a negative on top of the slip film. The plate and negative are then subjected to flood-exposure by UV light through the negative. The areas exposed to the light cure, or harden, and the unexposed areas are removed (developed) to create the relief image on the printing plate.

In "digital" plate making processes, a laser is guided by an image stored in an electronic data file, and is used to create an in situ negative on a digital (i.e., laser ablatable) masking layer, which is generally a modified slip film (i.e., a slip film layer which has been doped with a UV-absorbing material, such as carbon black). Portions of the laser ablatable layer are ablated by exposing the masking layer to laser radiation at a selected wavelength and power of the laser.

The laser ablatable layer can be any photoablative masking layer known in the art. Examples of such laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety. The laser ablatable layer generally comprises a radiation absorbing compound and a polymeric binder. The radiation absorbing compound is chosen to be sensitive to the wavelength of the laser and is generally selected from dark inorganic pigments, carbon black, and graphite.

The polymeric binder is generally selected from polyacetals, polyacrylics, polyamides, polyimides, polybutylenes, polycarbonates, polyesters, polyethylenes, cellulosic polymers, polyphenylene ethers, polyethylene oxides, and combinations of the foregoing, although other suitable binders would also be known to those skilled in the art. The binder is selected to be compatible with the underlying photopolymer and easily removed during the development (wash) step. Preferred binders include polyamides, and cellulosic binders, such as hydroxypropyl cellulose.

The benefit of using a laser to create the image is that the printer need not rely on the use of negatives and all their supporting equipment, and can rely instead on a scanned and stored image, which can be readily altered for different purposes, thus adding to the printer's convenience and flexibility. When a negative is used, the slip film has to be transparent to the light used for curing. Since UV flood lamps normally provide the light for curing, the normal slip film is transparent in the range of 300–400 nm. Such films are well known in the photoprocessing field, and in principle, any such film may be modified by adding a suitable radiation-absorbing compound.

After imaging, the photosensitive printing element is developed to remove the masking layer and the unpolymerized portions of the layer of photocurable material to create a relief image on the surface of the photosensitive printing element. Typical methods of development include washing with various solvents or water, often with a brush. Other possibilities for development include the use of an air knife or heat plus a blotter.

Printing plates with laser ablatable masks can be used to form semi-continuous imaging elements. The flat sheet elements are cut to size and wrapped around a cylindrical form, usually a printing sleeve or the printing cylinder prior to imaging of the laser ablatable (digital) mask by a laser. A longitudinal seam is created by this process, which is often referred to as "plate-on-sleeve." This seam can be straight across the surface of the sleeve or cylinder, or can be made in an infinite variety of shapes through the use of manual or automated cutting methods. A common practice is to "stagger" the seam through a "stair step" pattern. "Staggered" seams are used to minimize rotational balance problems that can be caused by straight seams. Another practice that can be used to create circumferential seams is the use of separate plates arrayed in "lanes" over the cylinder. In this case, there are seams not only at the ends of each plate wrapped around the cylinder, but also between each lane. If care is not taken to cover the photocurable surfaces exposed by the cutting process with a material that is opaque to the UV radiation used to expose the plate, a phenomenon called "edge cure" can result.

Edge cure is caused by UV light contacting the cut edges and corners of the plate, which polymerizes the photopolymer and creates an undesirable raised border around the edges of the plate. This border must then be manually cut from the plate, which requires time and can result in damage to the plate, especially if portions of the images are near the plate edge. In addition, removal of the raised border may leave an undesirable residue on the plate, which must also be removed.

One current process used to prevent edge curing uses a felt tip pen that contains a UV-opaque ink as a means of sealing the edges of such plates. However, this is a slow, tedious process that is only about 90 percent effective at preventing edge curing of the plate.

Another process is described in U.S. Pat. No. 6,326,124 to Alince et al., the subject matter of which is herein incorporated by reference in its entirety. Alince et al. discloses an edge-covering material consisting essentially of at least one soluble, film-forming polymer, at least one UV absorber, and a solvent or solvent mixture that is applied on the edges of a photocurable printing plate before imagewise exposure of the printing plate to prevent unwanted ridges that result from exposure of printing plate edges. The edge-covering material is applied by brushing or spraying, preferably with a fine nozzle. Typical solvents are volatile solvents having a high solvent capability for the film-forming polymer, including toluene, xylene, methyl ethyl ketone, and ethyl acetate. However, with a solvent-borne formulation it is extremely difficult to remove the edge-covering material without damaging the imaging mask if it is accidentally applied to portions of the printing plate intended for imaging.

Thus, there remains a need in the art for improved methods of treating cut surfaces (i.e., edges and corners) of printing plates to prevent the formation of unwanted ridges on the edges of the plate and for a method that can be performed more easily and is more fault-tolerant than processes described in the prior art.

The inventors have surprisingly discovered that conventional, commercially available sunscreen formulations (or compositions containing similar ingredients) are highly effective edge-cure prevention agents. Furthermore, these formulations are easy to apply, non-toxic, inexpensive, and are largely compatible with the solvents used to wash uncured photopolymer from the printing plates during processing. In addition, such formulations can be easily wiped off the plate surface if necessary, with no damage to the digital mask. The lighter color of the sunscreen formulation also makes it easy to visually discern which areas of the edge are completely covered by the formulation.

The formulations of the invention are coated onto the edges of a printing plate after the printing plate has been cut to the desired size and shape. The improved process of the invention is more fault-tolerant as compared with comparable processes of the prior art. In addition, the formulations of the invention are non-toxic, and require no special precautions for handling or avoiding skin contact.

SUMMARY OF THE INVENTION

The present invention is directed to a method of preventing premature curing of cut surfaces of a photosensitive printing element comprising the steps of:
  a) providing a photosensitive printing element;
  b) cutting the photosensitive printing element in a pattern of a desired size and shape for mounting on a sleeve or cylindrical carrier; and
  c) applying an edge-covering composition to cover the cut surfaces of the printing element, wherein the edge-covering composition is an emulsion comprising:
    (i) one or more emulsifiers;
    (ii) one or more ultraviolet radiation-absorbing materials;
    (iii) optionally, a coloring agent; and
    (iv) optionally, one or more additives selected from the group consisting of thickeners, preservatives, stabilizers, viscosity modifiers, pH modifiers, surfactants rheology modifiers, polymers, and combinations of the foregoing.

After the element has been cut to the pattern of the desired size and shape, the element is mounted on the sleeve or cylindrical carrier.

The present invention is also directed to a photosensitive printing element that can be used to prepare a relief image printing plate in accordance with the present invention.

In a preferred embodiment, the composition of the invention is formulated to have a light color so that it may be easy to discern areas that have been coated with the emulsion composition.

DETAILED DESCRIPTION OF THE PREFERRED EMBODIMENTS OF THE INVENTION

The present invention is directed to a method of preventing premature curing of cut surfaces of a photosensitive printing element during the manufacturing process.

Photosensitive printing elements that may be treated with the novel compositions of the invention generally comprise a support layer, one or more layers of a photocurable material deposited on the support layer, and optionally, but preferably, at least one ablation layer deposited on the one or more layers of photocurable material that is ablatable by a laser at a selected wavelength and is sensitive to radiation at the selected wavelength and power of the laser.

The photosensitive printing element is first cut to a desired size and shape, as discussed in more detail above, for mounting on a sleeve or cylindrical carrier, and the novel composition of the invention is then applied to the cut surfaces of the printing plate. The edge-cure prevention composition covers the photocurable surfaces exposed by the cutting process and prevents the cut surfaces of the printing plate from curing during subsequent exposure and development of the printing plate. In a preferred embodiment, the edge cure prevention composition is applied after the plate is mounted to the printing sleeve or cylindrical carrier. In addition, it is also preferred that the printing element is imaged prior to application of the edge cure prevention composition.

The novel edge-cure prevention compositions of the invention are easy to apply, non-toxic, inexpensive and largely compatible with the solvents used to wash uncured photopolymer from plates during processing. The compositions of the invention are highly effective at preventing edge curing from occurring and offers many benefits over comparable edge cure prevention compositions of the prior art. The compositions of the invention can be applied using various dispensing devices, but are most easily and effectively applied using a pressurized dispenser with a fine nozzle applicator.

A further advantage to the edge-cure prevention compositions of the invention is that the application process is far more fault-tolerant than application processes of the prior art. With a solvent-borne formulation, such as described in U.S. Pat. No. 6,326,124 to Alince et al., it can be very difficult to remove the edge-covering material if it is accidentally applied to portions of the printing plate intended for imaging. In contrast, the edge-cure prevention compositions of the invention can be easily wiped off the plate surface if desired, without damage to the digital mask.

The edge-cure prevention composition of the invention is an emulsion that typically comprises:
  (a) one or more emulsifiers;
  (b) one or more ultraviolet radiation-absorbing materials;
  (c) optionally, a coloring agent; and
  (d) optionally, one or more additives selected from the group consisting of thickeners, preservatives, stabilizers, viscosity modifiers, pH modifiers, surfactants rheology modifiers, polymers, and combinations of the foregoing.

A stable emulsion is a mixture of two immiscible liquids (an aqueous phase and an oily phase), i.e. liquids that are not mutually soluble, but which can form a fluid in which very small droplets of one component are stably dispersed throughout the other liquid, giving the mixture the appearance of a homogeneous fluid. The presence of an emulsifier enhances the ability of one of the immiscible liquids to remain in a continuous form, while allowing the other immiscible liquid to remain in a dispersed, droplet form. Thus, one function of an emulsifier is to assist in the production of a stable emulsion. A secondary function of the emulsifier is to act as a thickening agent for the emulsion.

An oil-in-water (o/w) emulsion is an emulsion where water-insoluble droplets (the discontinuous phase) are dispersed in a continuous aqueous phase. A water-in-oil (w/o) emulsion is a mixture where water droplets (the discontinuous phase) are dispersed in a continuous oily phase. The type of emulsion formed, oil-in-water (o/w) or water-in-oil (w/o) may be determined by the volume ratio of the two liquids, provided that the ratio is sufficiently high. For moderate ratios, the type of emulsion is decided by several factors, including the order of addition or type of emulsifier.

Water is generally employed in an amount effective to form the emulsion. For example, the emulsions of the invention typically comprise water in an amount of about 35% to about 95% by weight, more preferably about 40% to about 80% by weight, and most preferably about 40% to about 75% by weight, based on the weight of the emulsion. It is generally preferable to use water that has been purified (i.e., by deionization or reverse osmosis). If desired, the aqueous phase may comprise one or more liquid water-miscible materials. Suitable materials include lower alcohols, such as ethanol, polyols, such as propylene glycol, glycerol, sorbitol, and polyglycerol, polyether materials, such as polyethylene glycol or polypropylene glycol having a molecular weight of 100 to 500, and ethoxylated polyols.

Example of suitable oils for use in the oily phase of the emulsion include hydrocarbons, including mineral oils, triglycerides, including vegetable oils and grain germ oils, various oily esters derived from long-chain acids and/or alcohols, animal oils silicone oils, long-chain alcohols, esters derived from lanolic acid, and the acetyl glycerides, the octanoates and decanoates of alcohols or of polyalcohols, and the ricinoleates of alcohols or of polyalcohols. Other suitable oils would also be well known to those skilled in the art. The oil is typically present in the emulsion in amount of about 5% to about 65% by weight, more preferably about 10% to about 65% by weight, and most preferably about 20% to about 60% by weight, based on the weight of the emulsion.

Suitable emulsifiers include, without limitation, sorbitan monooleate, sorbitan sesquioleate, sorbitan isostearate, sorbitan trioleate, PEG-22/dodecyl glycol copolymer, PEG-45/dodecyl glycol copolymer, polyglyceryl-3-diisostearate, polyglycerol esters of oleic/isostearic acid, polyglyceryl-6-hexaricinolate, polyglyceryl-4 oleate, polyglyceryl-4 oleate/PEG-8 propylene glycol cocoate, oleamide DEA, sodium glyceryl oleate phosphate, and hydrogenated vegetable glycerides phosphate. Other suitable emulsifiers include ceteareth-15, cetyl alcohol, cetyl phosphate, dimethicone copolyol phosphate, glyceryl isostearate, hydrogeneated lecithin, laureth-12, PEG-20 distearate, PEG-8 oleate, PEG-40 sorbitan diisostearate, polyglyceryl-10 distearate, polysorbate 20, polysorbate 80, PPG-7 lauryl ether, sodium laureth sulfate, sorbitan sesquioleate and acrylates/$C_{10-30}$ alkyl acrylate crosspolymer.

The one or more emulsifiers are generally usable in an amount between about 0.05% and about 20% by weight, more preferably between about 0.1 and about 15% by weight, and even more preferably between about 5% and about 10% by weight of the composition.

The UV-absorbing material can be any of a wide variety of materials that absorb radiation in the 290 to 400 nm wavelength region of the ultraviolet spectrum.

Typical UV-absorbing materials are those used in various sunscreen formulations and include, without limitation, p-aminobenzoic acid, cinoxate, avobenzone, diethanolamine methoxycinnamate, diagalloyl trioleate, dioxybenzone, ethyl 4-[bis(hydroxypropyl)]-aminobenzoate, glyceryl p-aminobenzoate, homosalate, lawsone together with dihydroxyacetone, menthyl anthranilate, octocrylene, octyl methoxycinnamate, octyl salicylate, oxybenzone, padimate O, padimate A, phenylbenzimidazole sulfonic acid, benzophenone-4, titanium dioxide, zinc oxide, triethanolamine salicylate and combinations of the foregoing Other suitable UV-absorbing materials would generally be known to those skilled in the art.

The UV-absorbing material(s) are used in an amount capable of preventing edge-curing from occurring during exposure of the imaged photopolymer printing plate. Preferably, the UV-absorbing material(s) is used in amount up to about 35% by weight, more preferably about 10% to about 30% by weight and more preferably about 15% to about 25% by weight of the composition.

Optionally, but preferably, a coloring agent may be added to the composition of the invention to allow for easy contrast between the black digital mask and the edge-cure prevention composition. In a preferred embodiment, the coloring agent is titanium dioxide, zinc oxide, or iron oxide in an amount sufficient to provide the composition of the invention with a light-colored appearance, so that it is easy to discern where the edge-cure prevention composition has been applied to determine if the cut edge has been completely covered by the edge-cure prevention composition. These colorants are also UV-absorbing materials and may aid in preventing edge-curing from occurring. The light color of the composition enables the user to easily determine if the composition has been accidentally applied to portions of the printing plate intended for imaging. A dye may be added to the composition as well, in order to improve the ease with which an operator can apply the composition or check for complete coverage of the intended surfaces. The dye may be completely cosmetic or may be a UV-absorbing compound.

Optionally, but preferably the emulsion composition of the invention may further comprise one or more additives selected from the group consisting of thickeners, preservatives, stabilizers, viscosity modifiers, pH modifiers, surfactants rheology modifiers, polymers, and combinations of the foregoing. These additives may be usable in various amounts to provide the desired flow and retention characteristics to the emulsion. One skilled in the art would be able to determine suitable amounts and types of additives for the formulations of the invention.

Thickeners may be used to increase the viscosity of the edge-cure prevention composition. Suitable thickeners include those selected from the group consisting of carboxylic acid polymers (especially carbomers), crosslinked polyacrylate polymers, polyacrylamide polymers, polysaccharides, and gums (i.e., xanthan gum). A discussion of suitable thickeners can be found in U.S. Pat. No. 5,976,513 to Robinson, the subject matter of which is herein incorporated by reference in its entirety.

Various polymers may be added to the emulsion compositions of the invention. These polymers may be different, depending on whether the emulsion is an oil-in-water (o/w) or a water-in-oil (w/o) emulsion. Examples of polymers that are suitable for use in the invention can be found in U.S. Pat. No. 5,989,529 to Kaplan and in U.S. Pat. No. 5,736,125 to Morawsky et al., the subject matter of each of which is herein incorporated by reference in its entirety.

Suitable polymers additives for an oil-in-water (o/w) emulsion include, without limitation, a polyhydroxylate block polymer, especially those containing an ABA structure containing poly(hydroxylated ester) blocks and polyethylene glycol blocks. The fatty acid of this emulsifying polymer generally has a $C_{12}$ to $C_{20}$ chain length. The esters may be oleates, palmitates, or stearates. The polyethylene glycol blocks of the emulsifying polymer preferably contain from about 4 to about 50 mol of ethylene oxide, more preferably from about 20 to about 40 mol of ethylene oxide. A preferred compound is polyethylene glycol dipolyhydroxystearate in which the polyethylene glycol contains 30 mol of ethylene glycol, commonly referred to as PEG 30 dipolyhydroxy stearate and available from ICI Americas, under the tradename Arlacel® P-135.

In the case of a water-in-oil emulsion, the polymer additive may comprise a copolymer having a hydrophobic functionality sufficient to provide at least partial solubility and optionally stability in oil and a hydrophilic functionality sufficient to provide thickening of the oil. The hydrophobic functionality is necessary to provide at least partial solubility and preferably stability in oil. The hydrophobic functionality may be provided by a hydrophobic constituent commonly used in the art, including $C_{10}$–$C_{22}$ acrylates and methacrylates, $C_{10}$–$C_{22}$ acrylamides and methacrylamides, $C_{10}$–$C_{22}$ vinyl ethers and esters, siloxanes, and $C_{10}$–$C_{22}$ alpha olefins, fluorinated aliphatic side-chains of at least 6 atoms, and alkyl styrene side-chains wherein the alkyl is of 1 to 24 carbon atoms. The hydrophobic functionally generally comprises from about 80% to about 98%, by weight of the copolymer. The hydrophilic functionality is necessary to thicken the oil and may comprise $C_3$–$C_6$ α,β-ethylenically unsaturated carboxylic monoacid, $C_4$–$C_6$-unsaturated carboxylic diacid, or a monoester or monoamide of such carboxylic diacid. Unsaturated carboxylic monoacids include acrylic acid, methacrylic acid, and crotonic acid. Unsaturated carboxylic diacids include maleic acid and itaconic acid. The monoesters and monoamides are derived from alcohols or amines containing from 1 to 22 carbon atoms.

During preparation of the emulsion, the pH may be adjusted as necessary. The pH is generally preferred to be within the range of 4 to 9, more preferably about 6.5 to about 7.5, and most preferably neutral (7).

The present invention is also directed to a method of preventing premature curing of cut edges of a photopolymerizable printing element comprising the steps of:
  (a) providing a photopolymerizable printing element comprising:
    (i) a support layer;
    (ii) one or more layers of a photopolymerizable material deposited on the support layer; and
    (iii) optionally, but preferably, at least one ablatable layer deposited on the one or more layers of photopolymerizable material, wherein the at least one ablatable layer is ablatable by a laser at a selected wavelength and power, and wherein the ablatable layer comprises a radiation absorbing material that is sensitive to radiation at a selected wavelength and power of the laser;
  (b) cutting the photopolymerizable printing element in a pattern of a desired size and shape for mounting on a printing sleeve or cylindrical carrier; and
  (c) applying an edge-cure prevention composition to the cut surfaces of the photopolymerizable printing element, wherein the edge-cure prevention composition is an emulsion comprising:
    (i) one or more emulsifiers;
    (ii) one or more ultraviolet radiation-absorbing materials;
    (iii) optionally, a coloring agent; and
    (iv) optionally, one or more additives selected from the group consisting of thickeners, preservatives, stabilizers, viscosity modifiers, pH modifiers, surfactants rheology modifiers, polymers, and combinations of the foregoing.

In a preferred embodiment, the photopolymerizable printing element is mounted on the printing sleeve or cylindrical carrier, and then the edge-cure prevention composition is applied to the cut edges of the photopolymerizable printing element, The method further comprises the steps of: 1) selectively ablating the at least one ablation layer with the laser to provide ablated and nonablated areas forming an image; 2) flood exposing the laser imaged printing plate to UV light without a negative, thereby curing the one or more photocurable layers in areas under ablated areas of the ablation layer; and 3) treating the flood exposed laser imaged printing plate with at least one developer solution to remove the at least one ablation layer that was not removed during the laser ablation step and the areas of the one or more photocurable layers that were not exposed to actinic radiation. The edge cure prevention composition of the invention is most preferably applied after the cut plate has been mounted on the printing sleeve or cylindrical carrier and the printing plate has been imaged. In the case of digital printing plates, the edge cure prevention composition is applied after the masking layer has been ablated.

The edge cure prevention composition of the invention is also fully compatible with various other processing technologies, most notably thermal processing to remove unexposed photopolymer. During thermal processing, the relief structure formed during the imaging step is accomplished by contacting the photopolymerizable (radiation curable) layer with a preheated web of absorbent material. The heat in the absorbent web is transferred to the radiation curable layer upon contact, and the temperature of the radiation curable layer is raised to a temperature sufficient to enable the uncured portions of the radiation curable layer to soften or liquefy and be absorbed into the absorbent web. While still in the heated condition, the absorbent sheet material is separated from the cured radiation curable layer in contact with the support layer to reveal the relief structure. After cooling to room temperature, the resulting flexographic printing plate can be mounted on a printing plate cylinder.

The edge-cure prevention compositions of the invention are easy to apply, non-toxic, inexpensive and largely compatible with the solvents used to wash uncured photopolymer from the printing element to reveal the relief image during the development step of the process.

The formulations are applied using a number of dispensing devices, including spraying, brushing, and printing. However the edge-cure prevention compositions are most easily and effectively applied using a pressurized dispenser with a fine nozzle applicator.

What is claimed is:

1. A method of preventing premature curing of cut surfaces of a photosensitive printing element, the method comprising the steps of:
    a) providing a photosensitive printing element;
    b) cutting the photosensitive printing element in a pattern of a desired size and shape for mounting on a sleeve or cylindrical carrier; and
    c) applying an edge-covering composition to cover the cut surfaces of the printing element, wherein the edge-covering composition is an emulsion comprising an oily phase and an aqueous phase, said emulsion comprising:
        (i) water;
        (ii) at least one oil;
        (iii) one or more emulsifiers;
        (iv) one or more ultraviolet radiation-absorbing materials;
        (v) optionally, a coloring agent; and
        (vi) optionally, one or more additives selected from the group consisting of thickeners, preservatives, stabilizers, viscosity modifiers, pH modifiers, surfactants rheology modifiers, polymers, and combinations of the foregoing.

2. The method according to claim 1, further comprising a step of mounting the photosensitive printing element on the sleeve or cylindrical carrier after the photosensitive printing element has been cut to the pattern of the desired size and shape.

3. The method according to claim 2, wherein the edge cure prevention composition is applied to the cut surfaces of the printing element after the priming element has been mounted on the sleeve or cylindrical carrier.

4. The method according to claim 1, further comprising a step of imaging the photosensitive printing element before the edge cure prevention composition is applied to the cut surfaces of the printing element.

5. The method according to claim 1, wherein the at least one oil is selected from the group consisting of mineral oils, vegetable oils, grain germ oils, oily esters derived from long-chain acids and/or alcohols, animal oils, silicone oils, long-chain alcohols, esters derived from lanolic acid, and the acetyl glycerides, octanoates and decanoates of alcohols or of polyalcohols, ricinoleates of alcohols or of polyalcohols, and combinations of the foregoing.

6. The method according to claim 5, wherein the oil is present in the emulsion at a concentration of about 5% to about 65% by weight.

7. The method according to claim 1, wherein the aqueous phase comprises one or more liquid water-miscible materials selected from the group consisting of ethanol, propylene glycol, glycerol, sorbitol, polyglycerol, polyethylene glycol, ethoxylated polyols, and combinations of the foregoing.

8. The method according to claim 1, wherein the water is present in the emulsion at a concentration of about 35% to about 95% by weight.

9. The method according to claim 8, wherein the polymeric additive is polyethylene glycol dipolyhydroxystearate and the polyethylene glycol contains 30 mol of ethylene glycol.

10. The method according to claim 1, wherein the one or more emulsifiers are selected from the group consisting of sorbitan monooleate, sorbitan sesquioleate, sorbitan isostearate, sorbitan trioleate, PEG-22/dodecyl glycol copolymer, PEG-45/dodecyl glycol copolymer, polyglyceryl-3-diisostearace, polyglycerol esters of oleic/isostearic acid, polyglyceryl-6-hexaricinolate, polyglyceryl-4 oleate, polyglyceryl-4 oleate/PEG-8 propylene glycol cocoate, oleamide DEA, sodium glyceryl oleate phosphate, hydrogenated vegetable glycerides phosphate, ceteareth-15, cetyl alcohol, cetyl phosphate, dimethicone copolyol phosphate, glyceryl isosearate, hydrogenated lecithin, laureth-12, PEG-20 distearate, PEG-8 oleate, PEG-40 sorbitan diisostearate, polyglyceryl-10 distearate, polysorbate 20, polysorbate 80, PPG-7 lauryl ether, sodium laureth sulfate, sorbitan sesquioleate, acrylates/$C_{10-30}$ alkyl acrylate crosspolymer, and combinations of the foregoing.

11. The method according to claim 1, wherein the emulsion comprises a polymer additive and the polymer additive is a polyhydroxylate block polymer comprising poly(hydroxylated ester) blocks and polyethylene glycol blocks.

12. The method according to claim 11, wherein the ester is selected from the group consisting of oleates, palmitates, and stearates.

13. The method according to claim 11, wherein the polyethylene glycol blocks of the emulsifying polymer contain from about 4 to about 50 mol of ethylene oxide.

14. The method according to claim 1, wherein the ultraviolet radiation-absorbing material is selected from the group consisting of p-aminobenzoic acid, cinoxate, avobenzone, diethanolamine methoxycinnamate, diagalloyl trioleate, dioxybenzone, ethyl 4-[bis(hydroxypropyl)]-aminobenzoate, glyceryl p-aminobenzoate, homosalate, lawsone together with dihydroxyacetone, menthyl anthranilate, octocrylene, octyl methoxycinnamate, octyl salicylate, oxybenzone, padimate O, padimate A, phenylbenzimidazole sulfonic acid, benzophenone-4, titanium dioxide, zinc oxide, triethanolamine salicylate and combinations of the foregoing.

15. The method according to claim 1, wherein the emulsion comprises a coloring agent selected from the group consisting of zinc oxide, titanium dioxide, and combinations of the foregoing.

16. The method according to claim 1, wherein the one or more additives comprise a thickener selected from the group consisting of carboxylic acid polymers, crosslinked polyacrylate polymers, polyacrylamide polymers, polysaccharides, gums, and combinations of the foregoing.

17. The method according to claim 1, wherein the photosensitive printing element comprises:
  a) a support layer;
  b) one or more layers of a photocurable material deposited on the support layer; and
  c) at least one ablation layer deposited on the one or more layers of phorocurable material, wherein the at least one ablation layer is ablatable by a laser at a selected wavelength and power, and wherein the ablation layer comprises a radiation absorbing material that is sensitive to radiation at the selected wavelength and power of the laser.

18. The method according to claim 17, further comprising the steps of:
  selectively ablating portions of the at least one ablation layer with the laser to provide ablated and nonablated areas forming an image;
  flood exposing the laser imaged printing element to UV light without a negative, thereby curing the one or more photocurable layers in areas under ablated areas of the ablation layer; and
  treating the flood exposed laser imaged printing element to develop away the at least one ablation layer that was not removed during the laser ablation step and the areas of the one or more photocurable layers that were not exposed to actinic radiation.

19. A method of preventing premature curing of cut surfaces of a photosensitive printing element, the method comprising the steps of:
  a) providing a photosensitive printing element, said photosensitive printing element comprising:
    i) a support layer;
    ii) one or more layers of a photocurable material deposited on the support layer, and
    iii) at least one ablation layer deposited on the one or more layers of photocurable material, wherein the at least one ablation layer is ablatable by a laser at a selected wavelength and power, and wherein the ablation layer comprises a radiation absorbing material that is sensitive to radiation at the selected wavelength and power of the laser;
  b) cutting the photopolymer printing element in a pattern of a desired size and shape for mounting on a sleeve or cylindrical carrier; and
  c) applying an edge-cure prevention composition to the cut surfaces of the printing element, wherein the edge-cure prevention composition is an emulsion comprising an oily phase and an aqueous phase, said emulsion comprising:
    (i) water;
    (ii) at least one oil;
    (iii) one or more emulsifiers;
    (iv) one or more ultraviolet radiation-absorbing materials;
    (v) optionally, a coloring agent; and
    (vi) optionally, one or more additives selected from the group consisting of thickeners, preservatives, stabilizers, viscosity modifiers, pH modifiers, surfactants rheology modifiers, polymers, and combinations of the foregoing;
  wherein the edge-cure prevention composition covers the photocurable surfaces exposed by the cutting process and substantially prevents the cut surfaces of the printing plate from curing during subsequent exposure and development of the printing plate.

20. The method according to claim 19, further comprising a step of mounting the photosensitive printing plate on the sleeve or cylindrical carrier after the printing plate has been cut in the pattern of the desired size and shape.

21. The method according to claim 20, wherein the edge cure prevention composition is applied to the cut surfaces of the printing element after the printing element has been mounted on the sleeve or cylindrical carrier.

22. The method according to claim 19, further comprising a step of imaging the photosensitive printing element before the edge cure prevention composition is applied to the cut surfaces of the printing element.

* * * * *

UNITED STATES PATENT AND TRADEMARK OFFICE
CERTIFICATE OF CORRECTION

PATENT NO. : 7,179,583 B2
APPLICATION NO. : 10/977049
DATED : February 20, 2007
INVENTOR(S) : Albert Roshelli et al.

It is certified that error appears in the above-identified patent and that said Letters Patent is hereby corrected as shown below:

Column 10

Lines 32-33, delete "polyglyceryl-3-diisostearace" and replace it with --polyglyceryl-3-diisostearate--

Column 11

Line 16, delete "phorocurable" and replace it with --photocurable--

Signed and Sealed this

Seventeenth Day of April, 2007

JON W. DUDAS
*Director of the United States Patent and Trademark Office*